(12) United States Patent
Makino et al.

(10) Patent No.: US 8,068,526 B2
(45) Date of Patent: Nov. 29, 2011

(54) SEMICONDUCTOR OPTICAL DEVICE

(75) Inventors: Shigeki Makino, Kokubunji (JP);
Takeshi Kitatani, Hino (JP); Tomonobu Tsuchiya, Hachioji (JP)

(73) Assignee: Opnext Japan, Inc., Yokohama-shi (JP)

( * ) Notice: Subject to any disclaimer, the term of this patent is extended or adjusted under 35 U.S.C. 154(b) by 0 days.

(21) Appl. No.: 12/628,834

(22) Filed: Dec. 1, 2009

(65) Prior Publication Data
US 2010/0189154 A1 Jul. 29, 2010

(30) Foreign Application Priority Data

Dec. 2, 2008 (JP) .................. 2008-306963
Nov. 19, 2009 (JP) .................. 2009-263472

(51) Int. Cl.
*H01S 5/00* (2006.01)
*H01S 3/097* (2006.01)
(52) U.S. Cl. ............... 372/43.01; 372/50.11; 372/87
(58) Field of Classification Search ............ 372/43.01, 372/50.1, 50.11, 50.21, 50.22, 81, 87
See application file for complete search history.

(56) References Cited

U.S. PATENT DOCUMENTS

| 5,036,023 A * | 7/1991 | Dautremont-Smith et al. ............... 438/605 |
| 2002/0168856 A1* | 11/2002 | Iga et al. .................. 438/689 |
| 2008/0095206 A1 | 4/2008 | Katsuyama et al. |

FOREIGN PATENT DOCUMENTS

| JP | 2000-332287 A | 11/2000 |
| JP | 2002-344087 A | 11/2002 |
| JP | 2008-098297 A | 4/2008 |

* cited by examiner

*Primary Examiner* — Armando Rodriguez
(74) *Attorney, Agent, or Firm* — Miles & Stockbridge P.C.

(57) ABSTRACT

A purpose is to provide a semiconductor optical device having good characteristics to be formed on a semi-insulating InP substrate. Firstly, a semi-insulating substrate including a Ru—InP layer on a conductive substrate is used. Secondly, a semi-insulating substrate including a Ru—InP layer on a Ru—InP substrate or an Fe—InP substrate is used and semiconductor layers of an n-type semiconductor layer, a quantum-well layer, and a p-type semiconductor layer are stacked in this order.

17 Claims, 16 Drawing Sheets

RELATIONSHIP BETWEEN RESISTANCE AND CAPACITANCE

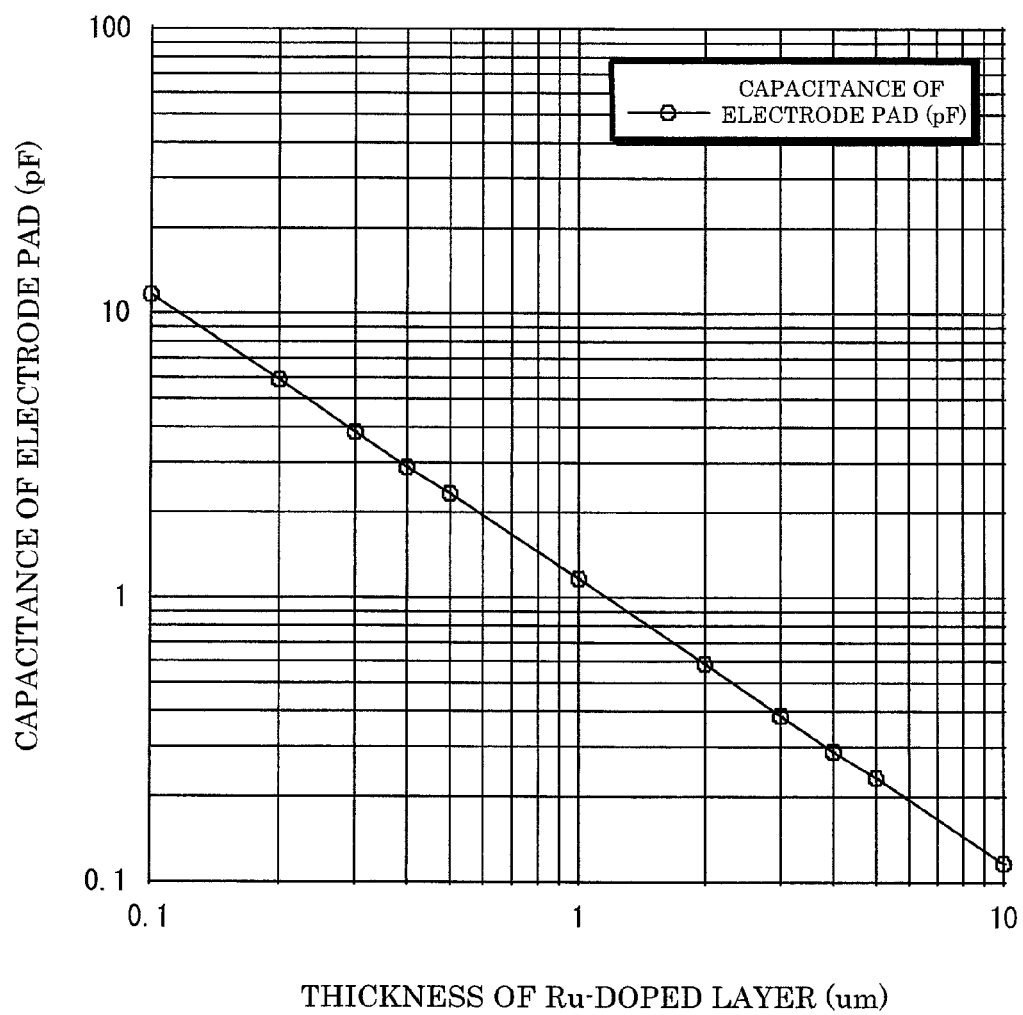

SEMICONDUCTOR OPTICAL DEVICE

CROSS-REFERENCE TO RELATED APPLICATION

The present application claims priorities from Japanese Patent Application No. JP 2008-306963 filed on De. 2, 2008, and Japanese Patent Application No. JP 2009-263472 filed on Nov. 19, 2009, the contents of which are hereby incorporated by reference into this application.

TECHNICAL FIELD OF THE INVENTION

The present invention relates to a semiconductor optical device composed of a semiconductor layer formed on a semi-insulating substrate.

BACKGROUND OF THE INVENTION

Along with the rapid spread of broadband network, achieving high speed, down-sizing, and high function have been important issues regarding optical communication devices. On the background, there is an increasing need for a semiconductor optical device (OEIC device) in which optical functional devices such as a semiconductor laser device, an optical modulator and a photodiode, which have been used as individual devices, are monolithically integrated on one substrate. The OEIC device has a lot of advantages such as down-sizing by forming a plurality of optical functional devices having different or similar functions on one substrate, cost reduction by reducing workload and the number of parts relating to optical coupling among individual devices, achieving high function and multiple function by integrating a plurality of functional devices having different functions, and so forth. In such an OEIC device, electric insulation between optical functional devices is very important since a plurality of optical devices formed in an array and a plurality of optical functional devices having different electric characteristics are simultaneously driven. For an InP substrate used in a semiconductor optical device in which electrodes are arranged on both surfaces of the device, an n-type or p-type conductive substrate or an insulating substrate is used.

Meanwhile, OEIC devices for optical communication suitable for 1.3 μm band and 1.55 μm band, which are low-dispersion and low-optical-loss bands of optical fibers for communication, are, in view of their easiness in manufacture, preferable to be formed on an InP (indium phosphorus) substrate having semi-insulating (SI) property and have electrodes aggregated on its one side. Such an SI—InP substrate using an InP substrate in which Fe (iron) is doped is disclosed in Japanese Patent Application Laid-Open Publication No. 2002-344087 (Patent Document 1). More specifically, Patent Document 1 discloses a structure in which, in the case of stacking a Zn—InP layer (Zn (zinc)-doped InP) as a p-type semiconductor layer on an Fe (iron)-InP substrate, a Ru—InP (Ru (ruthenium)-doped semi-insulating InP) layer is provided on an Fe—InP substrate, then a stacked body having stacked layers of p-type semiconductor layer, an active layer, an n-type semiconductor layer in this order is provided, and a p-electrode which supplies p-type carriers into the p-type semiconductor layer and an n-electrode which supplies n-type carriers to the n-type semiconductor layer are provided to one surface (a surface to stack the semiconductor layer) of the Fe—InP substrate together to prevent the resistivity as an SI—InP substrate from being lowered due to interdiffusion of Fe in the Fe—InP substrate and Zn in the Zn—InP.

SUMMARY OF THE INVENTION

The semiconductor optical device using the semi-insulating substrate disclosed in Patent Document 1 described above cannot achieve sufficient characteristics.

A preferred aim of the present invention is to improve characteristics of conventional semiconductor optical devices using a semi-insulating substrate.

Inventors of the present invention have studied causes of the characteristics degradation mentioned above, and found out two causes.

A first cause is a high etch pit density (EPD) of the Fe—InP substrate itself. A second cause is a new degradation mode such that the influence of interdiffusion cannot be completely suppressed even when a Ru—InP layer is interposed as Zn which is a p-type dopant and Fe which is a semi-insulating dopant do not directly contact with each other.

Consequently, to eliminate the characteristics degradation due to the first cause, while maintaining the order of stacking the layers of a p-type semiconductor layer, an active layer and an n-type semiconductor layer from the substrate side as it is, the semi-insulating substrate itself is multilayered to be a multilayered semi-insulating substrate having a Ru—InP layer provided on a conductive InP substrate.

Further, to eliminate the characteristics degradation due to the second cause, the device structure is changed to have the order of stacking the layers as an n-type semiconductor layer, an active layer, and a p-type semiconductor layer from the substrate side, and a Ru—InP substrate is used as the semi-insulating substrate itself on which the multilayered body is stacked; and alternatively, the semi-insulating substrate itself is multilayered to be a multilayered semi-insulating substrate having a Ru—InP layer provided on an Fe—InP substrate. Note that, as same as the way to eliminate the characteristics degradation due to the first cause, the same effects can be achieved when a multilayered semi-insulating substrate having a Ru—InP substrate provided on a conductive InP substrate is used.

According to the present invention, characteristics of conventional semiconductor optical devices using a semi-insulating substrate can be improved.

BRIEF DESCRIPTIONS OF THE DRAWINGS

FIG. 15 is a figure describing a relation between a capacitance of a Ru—InP buffer layer and a thickness of a Ru—InP film assuming an n-electrode area of an OEIC device of 100 μm×100 μm.

DESCRIPTIONS OF THE PREFERRED EMBODIMENTS

Figure 1A:
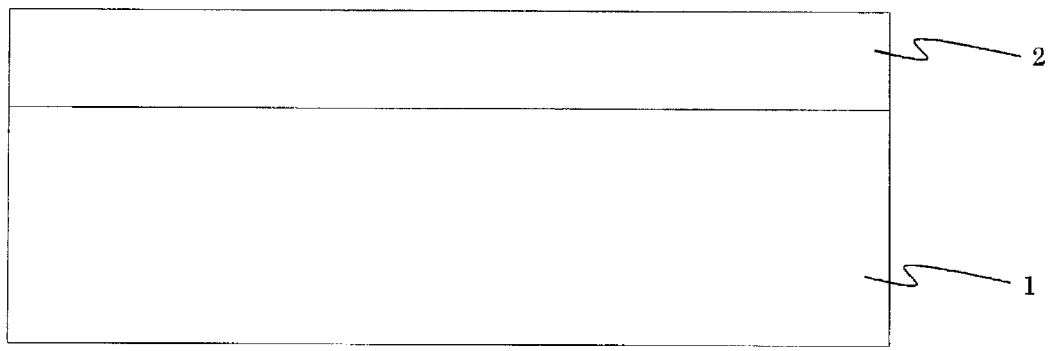
FIG. 1A is a cross-sectional view of a multilayered semi-insulating substrate having a Ru-doped SI—InP layer on a Zn-doped conductive InP substrate.

While respective inventions in the present Application will be described with the embodiments hereinafter, a summary of the inventions will be described first.

First, in a study on a method of improving characteristics of the conventional semiconductor optical device using a semi-insulating substrate, the inventors of the present invention have paid attention to the insulating property of the substrate itself. It is because there have been some cases that desired characteristics could not be obtained and stable characteristics could not be obtained when using a large wafer of 3-inch diameter to improve manufacture efficiency.

The Fe (iron)-InP substrate of Patent Document 1 has a higher EPD that causes lattice defects than that of a Zn (zinc)-doped p-conductive InP substrate (Zn—InP substrate) or a S (sulfur)-doped n-conductive InP substrate (S—InP substrate). For example, an EPD of a 2-inch Zn-doped p-InP substrate is about 200 $cm^{-2}$ and an EPD of a 2-inch S-doped n-InP substrate is about 400 $cm^{-2}$, while an EPD of a 2-inch Fe-doped SI—InP substrate is about 5000 $cm^{-2}$ having a ten-times or further higher EPD than the conductive substrates. As a high EPD causes an increase of crystal defects which are deeply correlated to the diffusion phenomenon, not only a lowering of the reliability but also a lowering of electric characteristics of the semiconductor optical device will be readily caused.

Therefore, in the semiconductor optical device in which an SI—InP substrate is used and electrodes are led out from only one side, more efforts are necessary to obtain characteristics at the same level with those of the semiconductor optical device using a conductive substrate in which electrodes are led out from both sides.

Accordingly, the inventors have considered a solution based on a concept different from that of forming the InP substrate itself of a semi-insulating material only. More specifically, they have employed a multilayered semi-insulating substrate having a semi-insulating InP layer provided on a surface of a conductive InP layer. As a result, it is able to achieve an SI—InP substrate having a small number of lattice defects (i.e., low EPD) and a stable insulating property. Further, at the same time, it is made possible to employ large-size substrates by achieving a low EPD, it is able to improve the manufacture efficiency. And, by using the substrate for an OEIC device, the insulating property among functional devices is improved to make it possible to achieve a semiconductor device having an OEIC device which is excellent in electric characteristics. Moreover, more specifically, a Ru—InP layer or an Os (osmium)—InP layer which is a semi-insulating layer is stacked on a S—InP substrate which is an n-InP substrate or a Zn—InP substrate which is a p-InP substrate. When a Ru—InP substrate is formed on a Zn-doped p-type or S-doped n-type InP substrate having a low EPD, an EPD of several hundreds of $cm^{-2}$ can be achieved also for the 3-inch diameter, so that supply of large-size InP substrates having a low EPD and semi-insulating function is made easier. In addition, by manufacturing semiconductor optical devices using the low-EPD SI—InP substrate, it is possible to suppress characteristics degradation caused by interdiffusion etc.

Note that the purpose of arranging the Ru—InP layer in Patent Document 1 is to prevent interdiffusion with Fe (iron) which is a dopant of the Si—InP substrate. Therefore, as the Ru—InP layer is inserted for a purpose of solving interdiffusion of Fe and Zn occurring in the structure using a Zn—InP layer which is a p-InP layer on an Fe—InP substrate being SI—InP, regardless of the interdiffusion of Fe and Zn, the invention described above which will not result in a semi-insulating substrate without a Ru—InP layer and Patent Document 1 are clearly different.

Next, the inventors have studied for finding another solution in a concept of forming an InP substrate itself only by a semi-insulating material. This is a second approach.

In the conventional semiconductor optical devices using a semi-insulating substrate in which a p-type semiconductor layer is arranged on the semi-insulating substrate, a Zn—InP layer has been arranged as a p-type semiconductor layer on an Fe—InP substrate that is an SI—InP substrate with interposing a Ru—InP layer. This way has been employed in view of interdiffusion caused by a contact between the Fe—InP layer and the Zn—InP layer as disclosed also in Patent Document 1, but sufficient characteristics could not be obtained.

Accordingly, the inventors made prototypes of semiconductor lasers using an Fe—InP substrate having an order of stacking layers of an n-type semiconductor layer, an active layer, and a p-type semiconductor layer from the substrate side to further prevent the influence of the interdiffusion. This way was employed as they expected a diffusion preventing effects by the n-type semiconductor layer as well as increasing a distance between the Fe—InP layer and the Zn—InP layer.

As a result, the influence of the interdiffusion was largely reduced as compared with that of the conventional stacking order. However, there were still problems in device characteristics and reliability in the prototyped semiconductor lasers as compared with the semiconductor lasers using a conductive substrate. Accordingly, the inventors have conducted analyses on each layer of the semiconductor layers to find the cause. As a result, it has been found out that Fe being contained in the substrate and Zn being contained in the p-type semiconductor layer mutually diffuse to slightly invade into the active layer even though a semiconductor layer of several μm and an n-type layer are interposed, resulting in the characteristics degradation.

In addition, it has been found out that the characteristics degradation phenomenon is more significant in semiconductor lasers and semiconductor optical amplifiers etc. having a high current value (several mA to several tens of mA) during the device operation as compared with that of light receiving devices. It is supposed to be attributed to the interdiffusion of Fe and Zn and an increase of the crystal dislocation deeply correlated to the interdiffusion being rapidly accelerated under a high operational current.

While it has been known that device characteristics are influenced by Fe—Zn interdiffusion in an interface of the semi-insulating layer containing Fe and the p-type layer containing Zn as described in Patent Document 1 as mentioned above, it is a new finding by the analyses revealing that the characteristics degradation is caused by interdiffusion phenomenon with the p-type semiconductor layer provided on the opposite side with interposing the active layer.

The inventors, from the new finding, considered an approach as a second approach, in a semiconductor optical device including a stacked body in which an n-type semiconductor layer, an active layer, and a p-type semiconductor layer are stacked in this order on an SI—InP substrate, to devise an SI—InP substrate maintaining the substrate itself at the lowest layer as an SI substrate.

More specifically, by employing the structure having the stacked body having an n-type semiconductor layer, an active layer, and a p-type semiconductor layer stacked in this order on a Ru—InP substrate, degradations of device characteristics and reliability caused by the interdiffusion of Fe and Zn occurring between the above-mentioned layers being away from each other is suppressed. This is because the Ru-doped InP substrate exhibits characteristics close to those of weak n-type while the Ru-doped InP substrate is substantially semi-insulative, and stacking the substrate with an n-type layer enhances the effect of suppressing diffusion of Fe and Zn. Thus, a structure in which an n-type semiconductor layer, an active layer, and a p-type semiconductor layer are sequentially grown to be stacked on a substrate having a Ru—InP layer on an Fe—InP substrate may be used. In addition, instead of the Ru—InP substrate, a structure in which a Ru—InP layer is stacked on a conductive substrate as described as the first approach can solve the above-mentioned problems. That is, without using an Fe—InP substrate, a structure in which an n-type semiconductor layer, an active layer, and a p-type semiconductor layer are sequentially grown to be stacked to a (single-layer or multilayered) semi-insulating substrate ensuring insulation properties by a Ru—InP substrate may be used. As a result, contamination of Zn or a semi-insulating dopant (Ru, Fe) which conventionally diffuses toward the active layer due to the interdiffusion phenomenon can be suppressed, and degradations of characteristics and reliability of semiconductor lasers and optical amplifiers can be extremely reduced.

Note that Patent Document 2 (Japanese Patent Application Laid-Open Publication No. 2000-332287) mentions about a Ru—InP substrate as an SI—InP substrate. However, in this case, it relates to a device structure in which a p-type semiconductor layer is directly formed on a Ru—InP substrate, and a necessity of inserting a low-concentration buffer layer is indicated as the interdiffusion cannot be completely suppressed in the stacking interface of the substrate and the p-type layer. Meanwhile, the present invention uses a device structure in which an n-type semiconductor layer is formed on a Ru—InP substrate and thus has different problems and means to solve the problems.

Further, the inventors have found out that using a Ru-doped SI—InP substrate which satisfies the following conditions is preferable.

First, a preferable dope of Ru to be doped into the substrate is in a range of $5\times10^{15}$ cm$^{-3}$ to $1\times10^{19}$ cm$^{-3}$. A concentration "higher than or equal to $5\times10^{15}$ cm$^{-3}$" obtains preferable insulating properties. A concentration "lower than or equal to $1\times10^{19}$ cm$^{-3}$" is a preferable range as a low-EPD and high-resistance SI—InP substrate in which segregation of Ru is suppressed.

In addition, it is preferable to set concentrations of Zn, Mg, Be, C, Si, S, and Sn in the Ru—InP substrate to be lower than or equal to $1\times10^{16}$ cm$^{-3}$. If these atoms excessively contaminate, there is a possibility that the atoms segregate to degrade the EPD. Further, even when the atoms are positioned inside the lattice, they act as conductive dopants in the InP substrate to lower the insulating properties of the Ru—InP substrate. Therefore, it is preferable to set the values of the elements to be lower than or equal to the values mentioned above.

Moreover, when a main surface of the Ru substrate is set to (100), it is preferable to give a slight inclination to the substrate surface. This is because it has been found out that the EPD in a crystal layer can be reduced in that manner. In that case, an inclination angle which can obtain the maximum effect is in a range of −0.05 degree to −0.2 degree. An orientation of the inclination is preferably [110] direction, but it is not limited to this. Requirements regarding the inclination are effective for reducing the effective EPD in the active layer to be crystal-grown on the Ru substrate in a device even when the EPD of the Ru substrate is slightly high.

It is needless to say that the present invention is effective for integrated elements and semiconductor amplifiers including a semiconductor laser, and integrated devices including the integrated elements and semiconductor amplifiers.

Note that, while the embodiments using Ru as a semi-insulating dopant will be described, the same effects can be obtained also when Os (osmium) is used instead of Ru.

First Embodiment

Figure 1B:
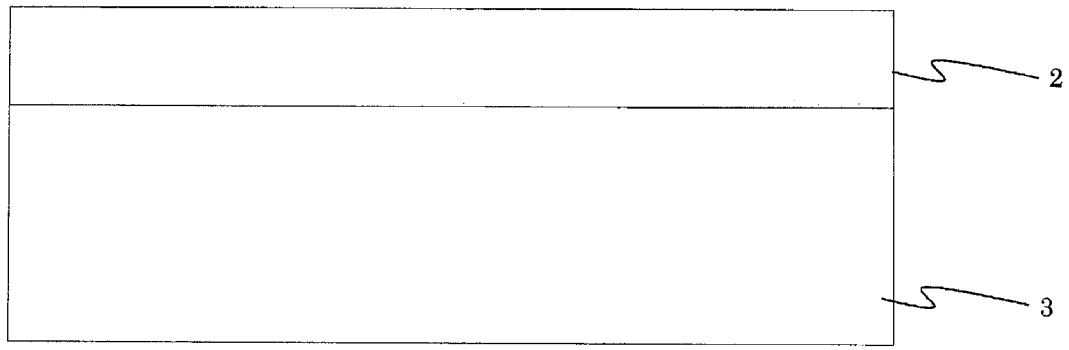
FIG. 1B is a cross-sectional view of a multilayered semi-insulating substrate having a Ru-doped SI—InP layer on a S-doped conductive InP substrate.

FIGS. 1A and 1B are cross-sectional views of an SI—InP substrate used in a first embodiment. FIG. 1A is a structure in which a Ru—InP layer is stacked on a Zn-doped InP substrate as a conductive InP substrate. FIG. 1B is a structure in which a Ru—InP layer is stacked on a S (sulfur)-doped InP substrate as a conductive InP substrate.

Figure 3:
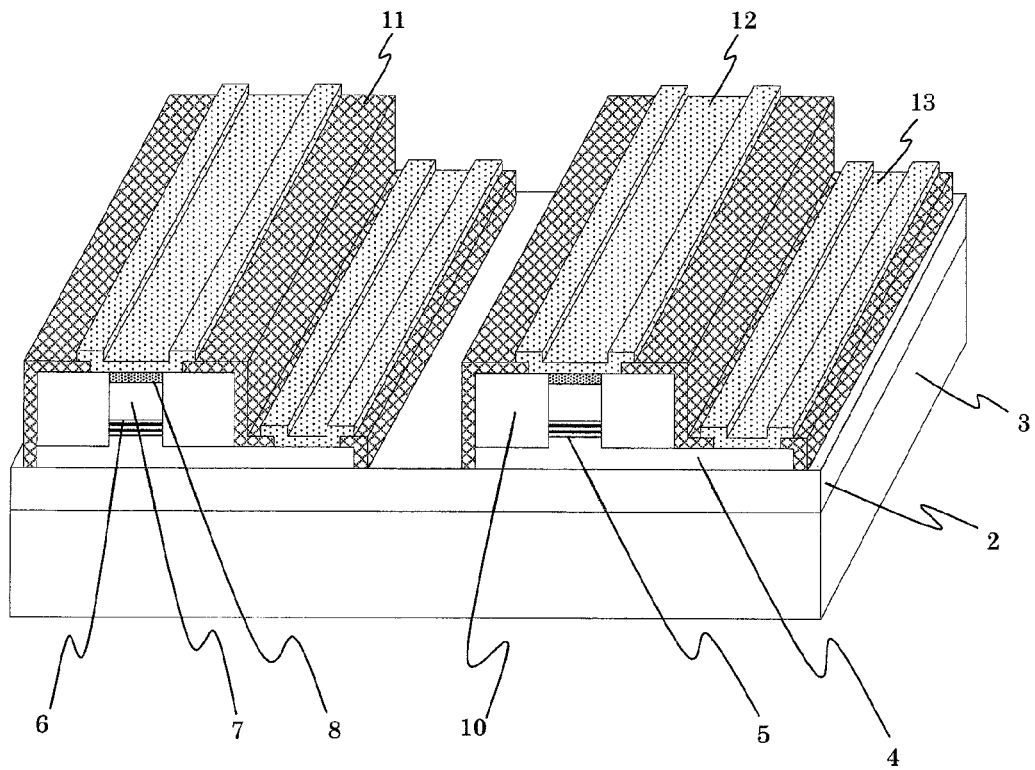
FIG. 3 is a perspective view of the semiconductor optical device according to the first embodiment.
Figure 4:
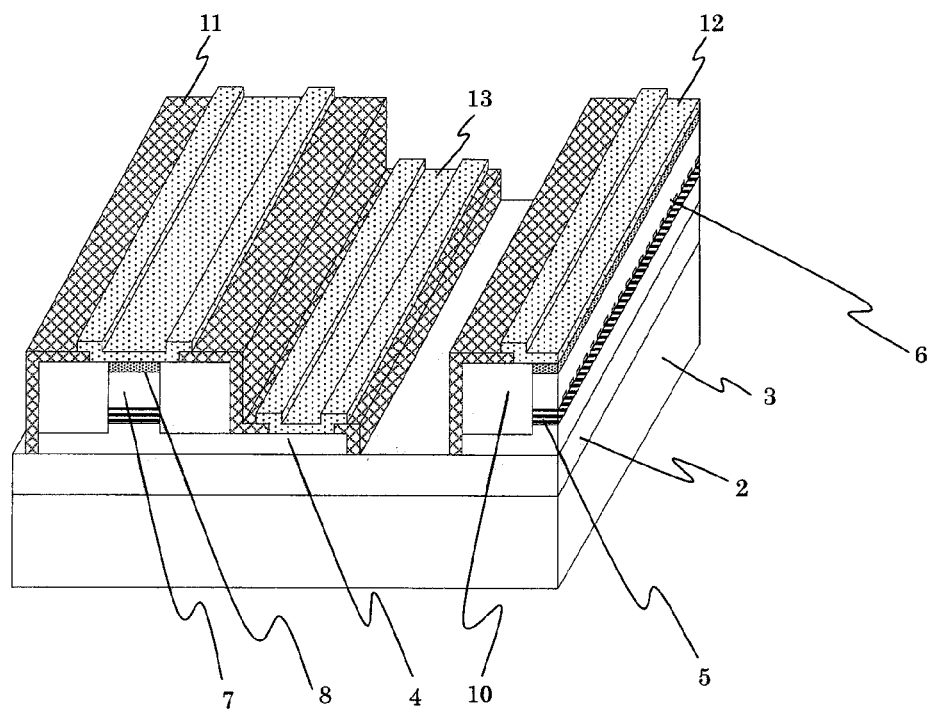
FIG. 4 is a figure describing a part of the cross-sectional view of the semiconductor optical device of the first embodiment viewed in a direction parallel to an optical axis.

FIG. 3 is a perspective view of a semiconductor optical device according to the first embodiment, and FIG. 4 is a partial cross-sectional view of the semiconductor optical device described in FIG. 3 in an optical axis direction.

A manufacturing process of the semiconductor optical device according to the first embodiment using the SI—InP substrate in FIGS. 1A and 1B will be described with reference to FIGS. 2A to 2I. Note that the figure only describes the embodiment and the size of the figure is not necessarily the same with the scale and curvature mentioned in the present embodiment.

Here, while the descriptions will be made using an n-InP substrate formed of S—InP, a p-InP substrate formed of Zn—InP may be used. In addition, while an example of using Ru—InP as the SI—InP substrate on the conductive InP substrate will be described, it can be an Os—InP layer.

Figure 2A:
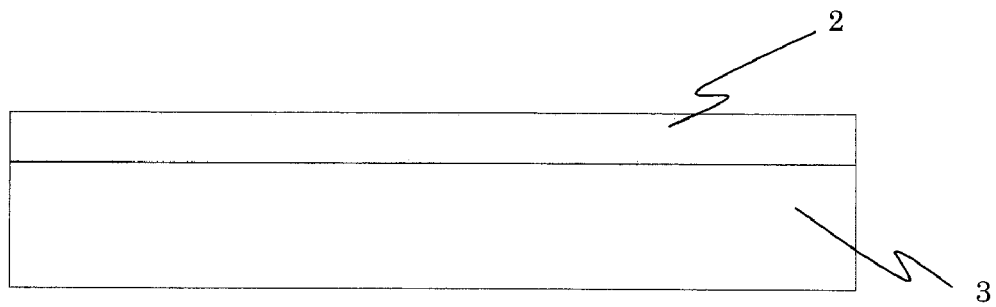
FIG. 2A is a figure describing a process flow of a semiconductor optical device for a first embodiment.
Figure 2B:
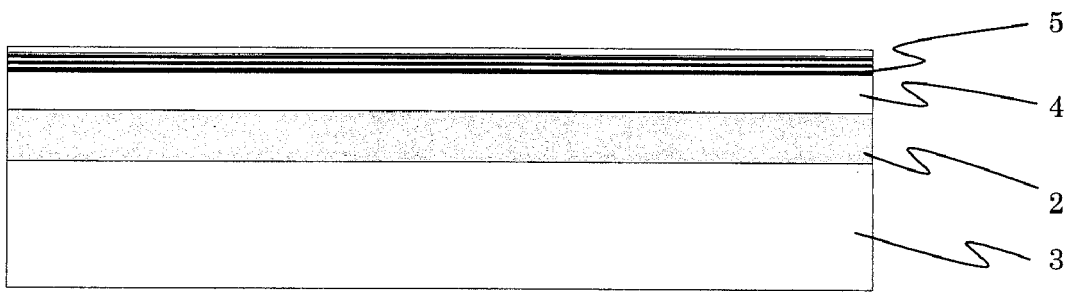
FIG. 2B is a figure describing the process flow of the semiconductor optical device for the first embodiment.
Figure 2C:
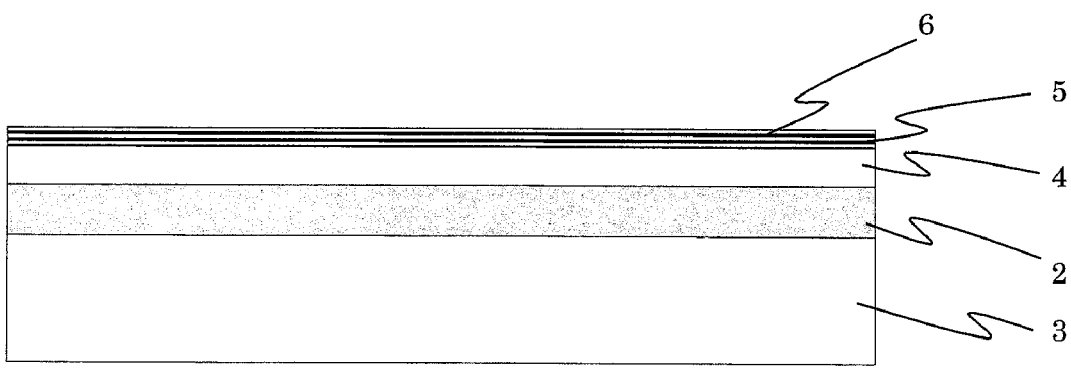
FIG. 2C is a figure describing the process flow of the semiconductor optical device for the first embodiment.
Figure 2D:
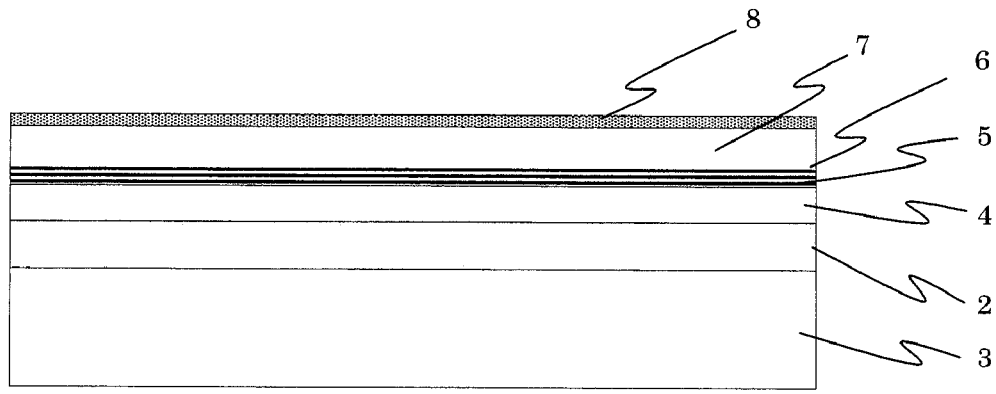
FIG. 2D is a figure describing the process flow of the semiconductor optical device for the first embodiment.
Figure 2E:
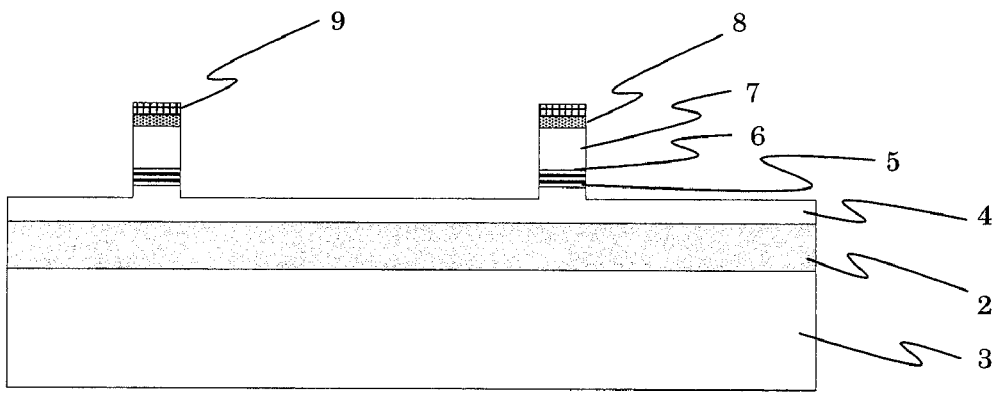
FIG. 2E is a figure describing the process flow of the semiconductor optical device for the first embodiment.
Figure 2F:
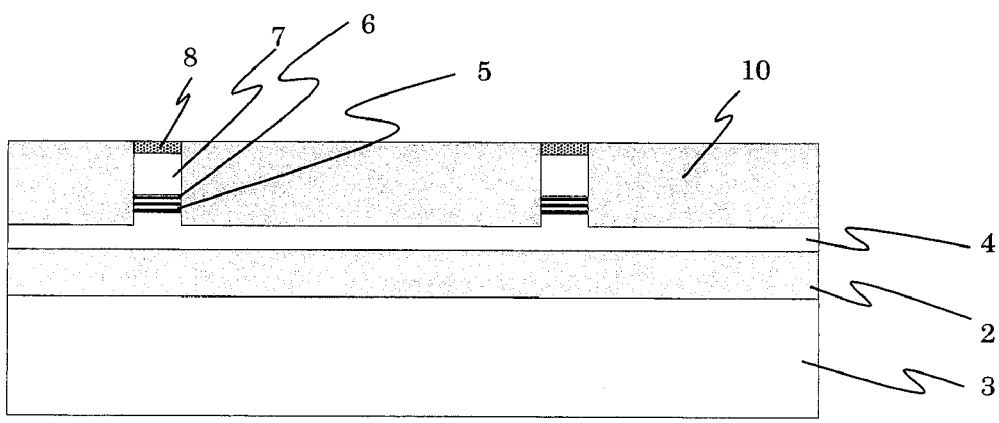
FIG. 2F is a figure describing the process flow of the semiconductor optical device for the first embodiment.
Figure 2G:
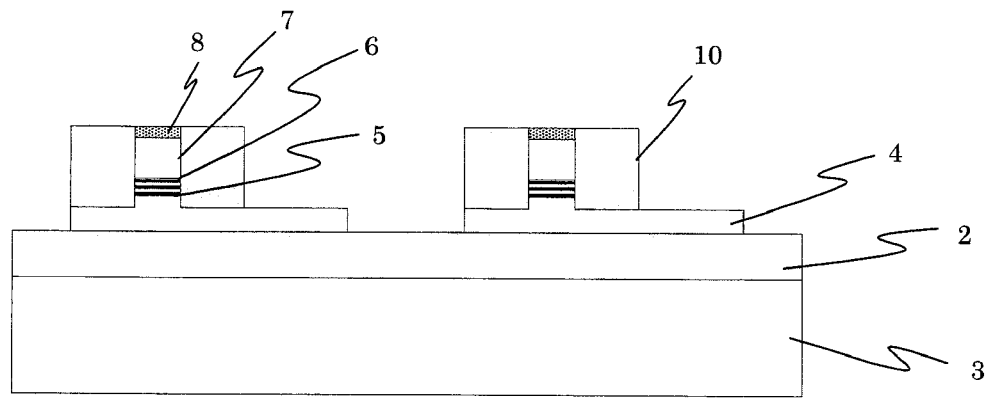
FIG. 2G is a figure describing the process flow of the semiconductor optical device for the first embodiment.
Figure 2H:
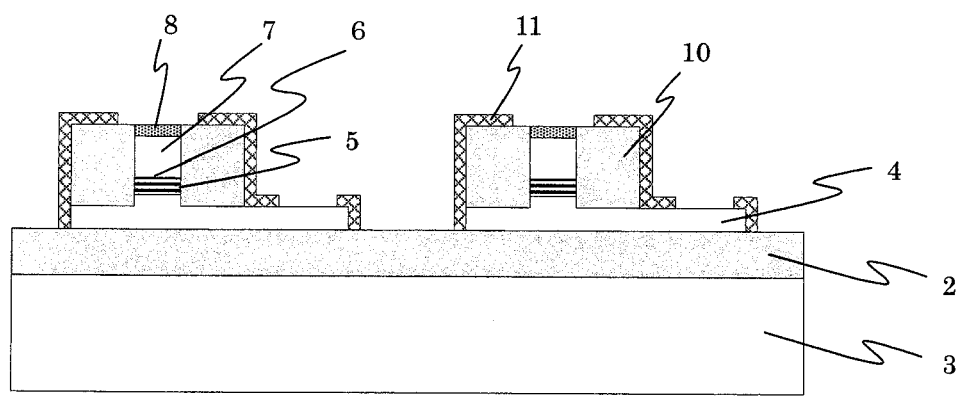
FIG. 2H is a figure describing the process flow of the semiconductor optical device for the first embodiment.
Figure 2I:
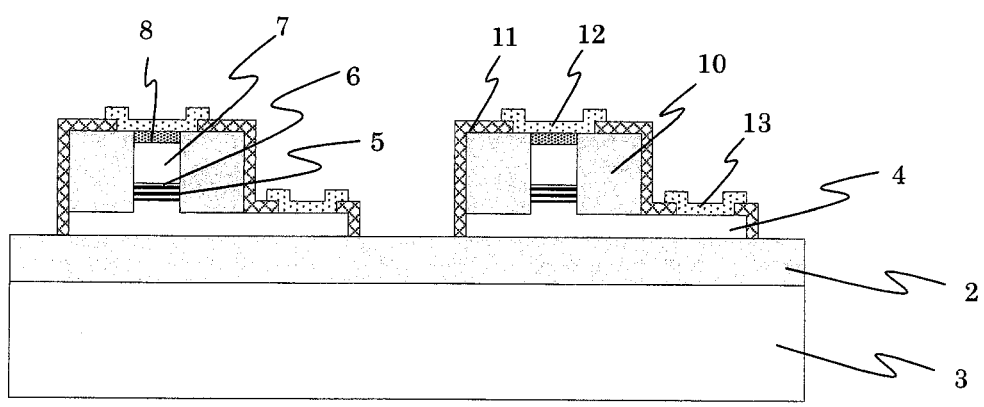
FIG. 2I is a figure describing the process flow of the semiconductor optical device for the first embodiment.

First, a multilayered semi-insulating substrate is formed by forming a Ru—InP layer as an SI—InP layer 2 on a S—InP substrate which is an n-InP substrate 3 by MOCVD (FIG. 2A). Subsequently, an n-InP cladding layer 4 formed of S—InP and an undoped quantum-well structure 5 are sequentially stacked (FIG. 2B). As a quantum well structure, an active layer which is suitable for laser oscillation can be formed by alternately stacking a quantum well layer and a barrier layer formed of In, Ga, Al, or As to be about 10 layers. Subsequently, a grating layer 6 is formed by a combination of interference exposure and etching (FIG. 2C). Subsequently, a p-InP cladding layer 7 formed of Zn—InP and a highly p-doped electrode contact layer 8 are sequentially stacked (FIG. 2D). Subsequently, a mesa is formed by a combination of photolithography and etching with using a multilayered dielectric mask 9 (FIG. 2E). Subsequently, a buried heterostructure is formed by regrowth of a semi-insulating InP layer 10 (FIG. 2F). Subsequently, by a combination of photolithography and etching, the semiconductor stacked body above the SI—InP layer 2 is etched so as to completely isolate the S—InP layer of the n-InP cladding layer 4 on the SI—InP layer 2 with respect to each of neighboring devices, and the semi-insulating InP layer 10 having the mesa buried therein in FIG. 2F is removed by etching for providing an electrode contact of the n-type side. At this time, it is necessary to adjust the depth of the etching so that the n-InP layer is remained with a desired thickness (FIG. 2G). Subsequently, after forming an insulating film 11 on the entire surface of the wafer, a through-hole is formed to the insulating film 11 by a combination of photolithography and etching so that only the contact layer 8 at a position to form an electrode contact of each of the p-type side and n-type side is exposed (FIG. 2H). For the insulating film 11 here, e.g., silicon oxide is suitable. Subsequently, to the through-holes formed in FIG. 2H, a p-electrode 12 and an n-electrode 13 of a known material Ti/Au or the like are formed, respectively (FIG. 2I, FIG. 4). Finally, the wafer is cleaved into bars and both edge surfaces are coated with a multilayered dielectric film having a desired reflectivity, thereby achieving a DFB laser array in which neighboring devices are electrically isolated. When the DFB laser array is singulated, DFB lasers are produced.

While a device having a buried hetero wave guide has been described in the present embodiment, it can be employed for a ridge waveguide and other waveguide structures in general.

In addition, while the configuration example of a distributed feedback (DFB) type laser has been described in the present embodiment, when a structure having a Ru—InP layer on the conductive InP structure is employed and an optical functional device selected from any of the following optical functional devices (A) to (D) is formed, a semiconductor optical device having a low-EPD and excellent characteristics can be manufactured with a large-size wafer also.

(A) Distributed feedback (DFB) laser, distributed Bragg reflector (DBR) laser, and semiconductor optical amplifier (SOA);

(B) Electroabsorption (EA) modulator, Mach-Zehnder (MZ) modulator, and optical directional coupler (DC) modulator;

(C) PIN photodiode (PD), and avalanche photodiode (APD); and (D) Passive waveguide, multimode interferometer (MMI), array waveguide grating (AWG).

Second Embodiment

Figure 5:
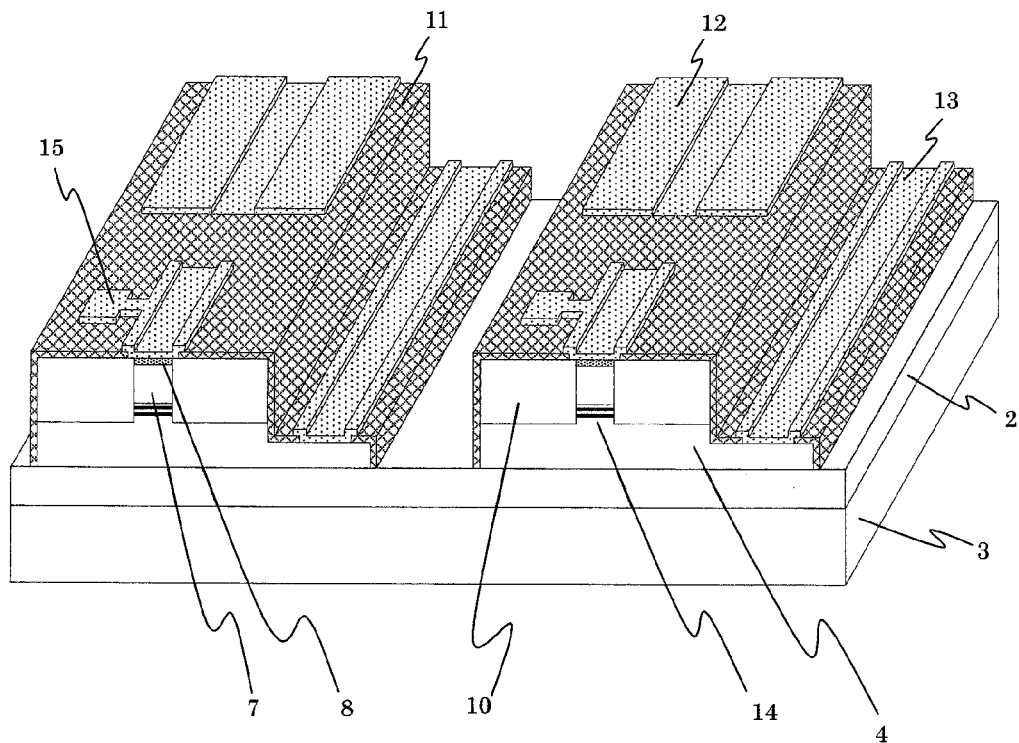
FIG. 5 is a perspective view of a semiconductor optical device (OEIC: optical electrical integrated circuit) for a second embodiment.

FIG. 5 is a perspective view of a semiconductor optical device (optical electrical integrated device: OEIC) according to a second embodiment. The semiconductor optical device is an EA/DFB laser in which an EA modulator and a DFB laser are integrated. Note that the figure only describes the embodiment and the size of the figure is not necessarily the same with the scale and curvature mentioned in the present embodiment. Here, the descriptions will be made with reference to an n-InP substrate formed of S—InP, but a p-InP substrate formed of Zn—InP may be used. In addition, the description will be made about an example of using Ru—InP as the SI—InP layer on a conductive InP substrate, it can be Os—InP layer also First, an SI—InP layer 2 to which Ru is doped is formed on an n-InP substrate 3 by MOCVD. Subsequently, an n-InP cladding layer 4 and an undoped quantum well structure are sequentially stacked. As the quantum well structure, a multiple-quantum-well 5 can be formed by alternately stacking a quantum well layer and a barrier layer formed of, for example, In, Ga, Al, or As to be about 10 layers. Subsequently, by a combination of photolithography and etching, with leaving an active layer having a desired length, the undoped quantum-well layer 5 is removed. At this time, a dielectric mask 9 is used as a mask in the etching. Subsequently, an undoped InGaAsP bulk layer to be a passive optical waveguide is regrown. Subsequently, with leaving a region corresponding to the DFB laser previously grown and the passive waveguide having a desired length, the undoped InGaAsP bulk layer is etched by a combination of photolithography and etching. Subsequently, an undoped quantum well layer to be an optical absorption layer 14 of the electroabsorption (EA) modulator is regrown. At this time, as the quantum-well structure, by alternatively stacking a quantum well layer and a barrier layer formed of, for example, In, Ga, Al, or As to be about 10 layers, a quantum-well structure suitable for an optical absorption layer 14 of the electroabsorption optical modulator can be formed. In addition, the order of regrowing respective optical functional parts is not limited to the above-mentioned one. Subsequently, a grating structure is formed only in a region corresponding to the DFB laser by a combination of interference exposure and etching. Subsequently, a p-InP cladding layer 7 and a p-doped p⁺-electrode contact 8 are sequentially stacked over the entire surface of the wafer. Subsequently, a mesa is formed by a combination of photolithography and etching. Subsequently, a buried heterostructure is formed by regrowing a semi-insulating InP layer 10. Subsequently, by a combination of photolithography and etching, the n-InP layer on the Ru-doped SI—InP is etched to be completely isolated among neighboring devices, and the SI—InP layer previously formed is removed by etching for an electrode contact on the n-type side. Here, it is necessary to adjust the depth of the etching so that the n-InP layer is left with a desired thickness. Subsequently, after forming an insulting film on the entire surface of the wafer, a p-electrode 12 of the DFB laser, a p-electrode 15 of the EA modulator, and an n-electrode 13 shared by the DFB laser and EA modulator are formed. Finally, the wafer is cleaved into bars, and both edge surfaces are coated with a multilayered dielectric film having a desired reflectivity, thereby achieving an EA/DFB laser array in which neighboring devices are electrically isolated. When the array is singulated, EA/DFB lasers are produced.

While a device having a buried hetero waveguide has been described in the present embodiment, when the device is used in a ridge waveguide and other waveguide structures in general, a semiconductor optical device having an OEIC device in which neighboring optical functional devices are electrically isolated can be achieved also in the same manner.

In addition, the OEIC device including only the EA modulator and DFB laser has been described to avoid complexity in the drawing in the present embodiment, but the OEIC device can achieve a characteristics improvement of semiconductor optical devices (OEIC devices) also, when any plurality of optical functional devices selected from the following optical functional devices of (A) to (D). Further, since a low-EPD multilayered semi-insulating substrate is employed, the yield can be increased even when the device is manufactured by large-size wafers.

(A) Distributed feedback (DFB) laser, distributed Bragg reflector (DBR) laser, and semiconductor optical amplifier (SOA);

(B) Electroabsorption (EA) modulator, Mach-Zehnder (MZ) modulator, and optical directional coupler (DC) modulator;

(C) PIN photodiode (PD), and avalanche photodiode (APD); and (D) Passive waveguide, multimode interferometer (MMI), array waveguide grating (AWG).

Third Embodiment

Figure 6:
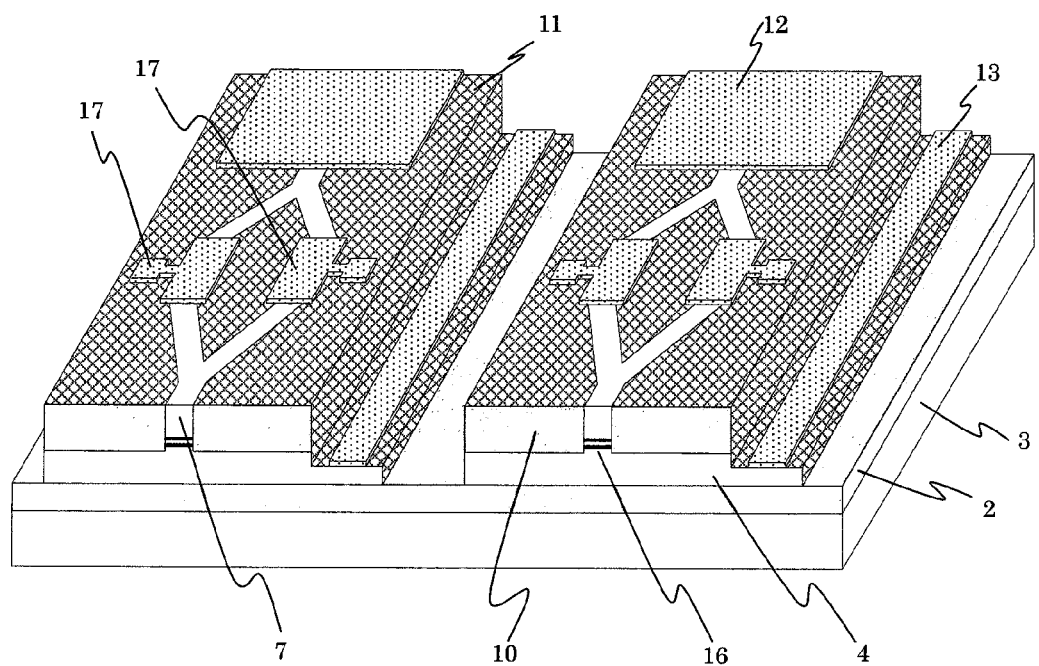
FIG. 6 is a perspective view of a semiconductor optical device (OEIC: optical electrical integrated circuit) for a third embodiment.

FIG. 6 is a perspective view of a semiconductor optical device (optical electrical integrated device: OEIC) according to a third embodiment. The semiconductor optical device is a MZ/DFB laser. Note that the figure only describes the embodiment and the size of the figure is not necessarily the same with the scale and curvature mentioned in the present embodiment. Here, the descriptions will be made with reference to an n-InP substrate formed of S—InP, but a p-InP substrate formed of Zn—InP may be used. In addition, the description will be made about an example of using Ru—InP as the SI—InP layer on a conductive InP substrate, it can be an Os—InP layer also. Incidentally, as a method of forming the optical integrated device of the third embodiment can be easily suggested from the second embodiment, detailed descriptions will be omitted here.

By applying the present invention, characteristics of semiconductor integrated device arrays in which a Mach-Zehnder modulator and a DFB laser are monolithically integrated can be improved.

While a device having a buried hetero waveguide has been described in the present embodiment, when the device is used in a ridge waveguide and other waveguide structures in general, a semiconductor optical device having an OEIC device in which neighboring optical functional devices are electrically isolated can be achieved also in the same manner.

In addition, the OEIC device including only the MZ modulator and DFB laser has been described to avoid complexity in the drawing in the present embodiment, but a semiconductor optical device having a low EPD and excellent in characteristics can be achieved also when the device is formed of any plurality of optical functional devices selected from the following optical functional devices of (A) to (D) with using a structure having a Ru—InP layer on a conductive InP substrate as described above. The device can be manufactured by large-size wafers.

(A) Distributed feedback (DFB) laser, distributed Bragg reflector (DBR) laser, and semiconductor optical amplifier (SOA);

(B) Electroabsorption (EA) modulator, Mach-Zehnder (MZ) modulator, and optical directional coupler (DC) modulator;

(C) PIN photodiode (PD), and avalanche photodiode (APD); and (D) Passive waveguide, multimode interferometer (MMI), array waveguide grating (AWG).

Moreover, the effects of the present invention are not essentially changed even when the laser part has a thermal or electric function of making the lasing wavelength tunable.

Fourth Embodiment

Figure 7:
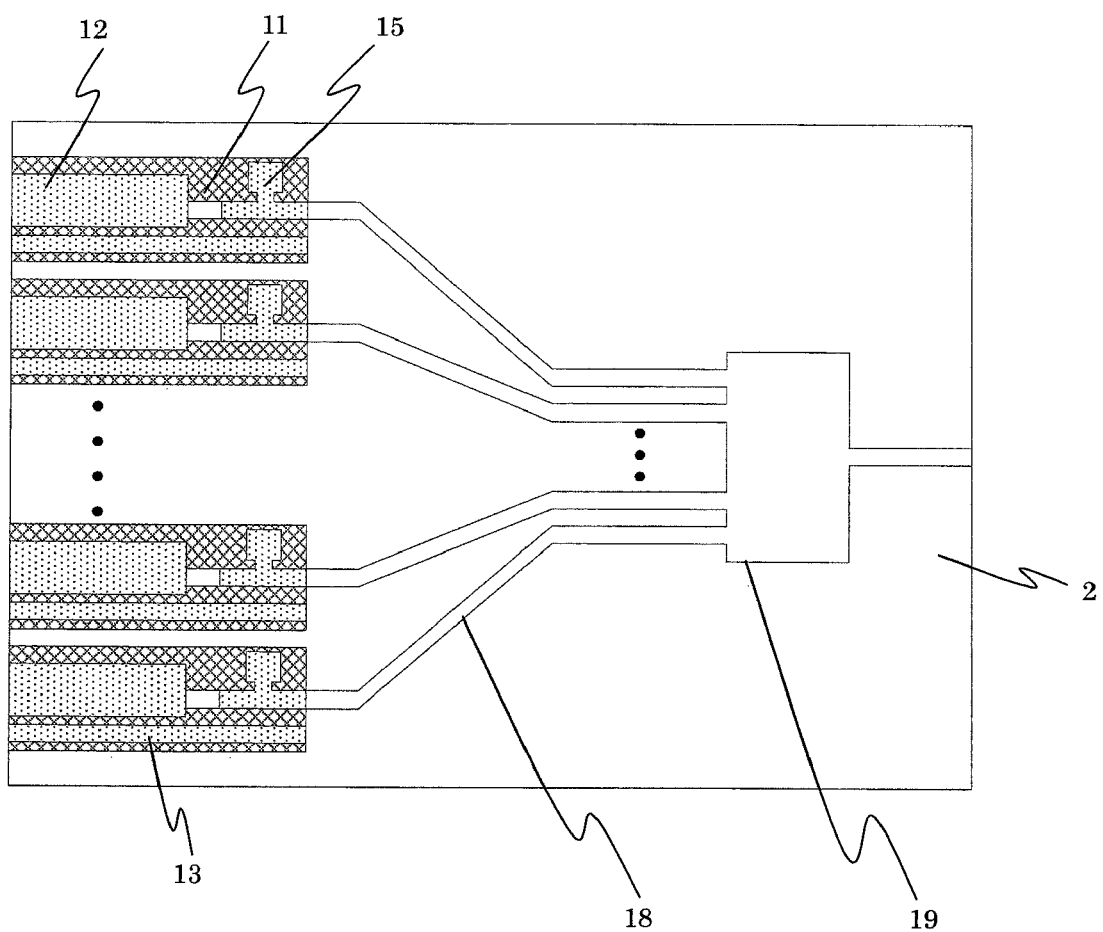
FIG. 7 is a perspective view of a semiconductor optical device (OEIC: optical electrical integrated circuit) for a fourth embodiment.

FIG. 7 is a perspective view of a semiconductor optical device (optical electrical integrated device: OEIC) according to a fourth embodiment. An EA/DFB laser array and a multimode interferometer (MMI) are integrated.

Note that the figure only describes the embodiment and the size of the figure is not necessarily the same with the scale and curvature mentioned in the present embodiment. Here, the descriptions will be made with reference to an n-InP substrate formed of S—InP, but a p-InP substrate formed of Zn—InP may be used. In addition, the description will be made about an example of using Ru—InP as the SI—InP layer on a conductive InP substrate, it can be an Os—InP layer also. Incidentally, as a method of forming the optical integrated device of the fourth embodiment can be easily suggested from the second embodiment, detailed descriptions will be omitted here.

In the present embodiment, optical outputs of the array-like EA/DFB laser can be concentrated to one waveguide using a multimode interferometer (MMI).

While a device having a buried hetero waveguide has been described in the present embodiment, when the device is used in a ridge waveguide and other waveguide structures in general, a semiconductor optical device having an OEIC device in which neighboring optical functional devices are electrically isolated can be achieved also in the same manner.

In addition, while a figure in which the EA/DFB laser and the multimode interferometer (MMI) are integrated is illustrated to avoid complexity in the present embodiment, the device can be manufactured by large-size wafers even when the device is formed of a plurality of optical functional devices selected from the following optical functional devices of (A) to (D).

(A) Distributed feedback (DFB) laser, distributed Bragg reflector (DBR) laser, and semiconductor optical amplifier (SOA);

(B) Electroabsorption (EA) modulator, Mach-Zehnder (MZ) modulator, and optical directional coupler (DC) modulator;

(C) PIN photodiode (PD), and avalanche photodiode (APD); and (D) Passive waveguide, multimode interferometer (MMI), array waveguide grating (AWG).

Moreover, the effects of the present invention are not essentially changed even when the laser part has a thermal or electric function of making the lasing wavelength tunable.

<Preferable Thickness of the Ru—InP film in the First to Fourth Embodiments>

Note that a preferable thickness of the Ru—InP film described in the first to fourth embodiments will be described in the following.

Figure 14:
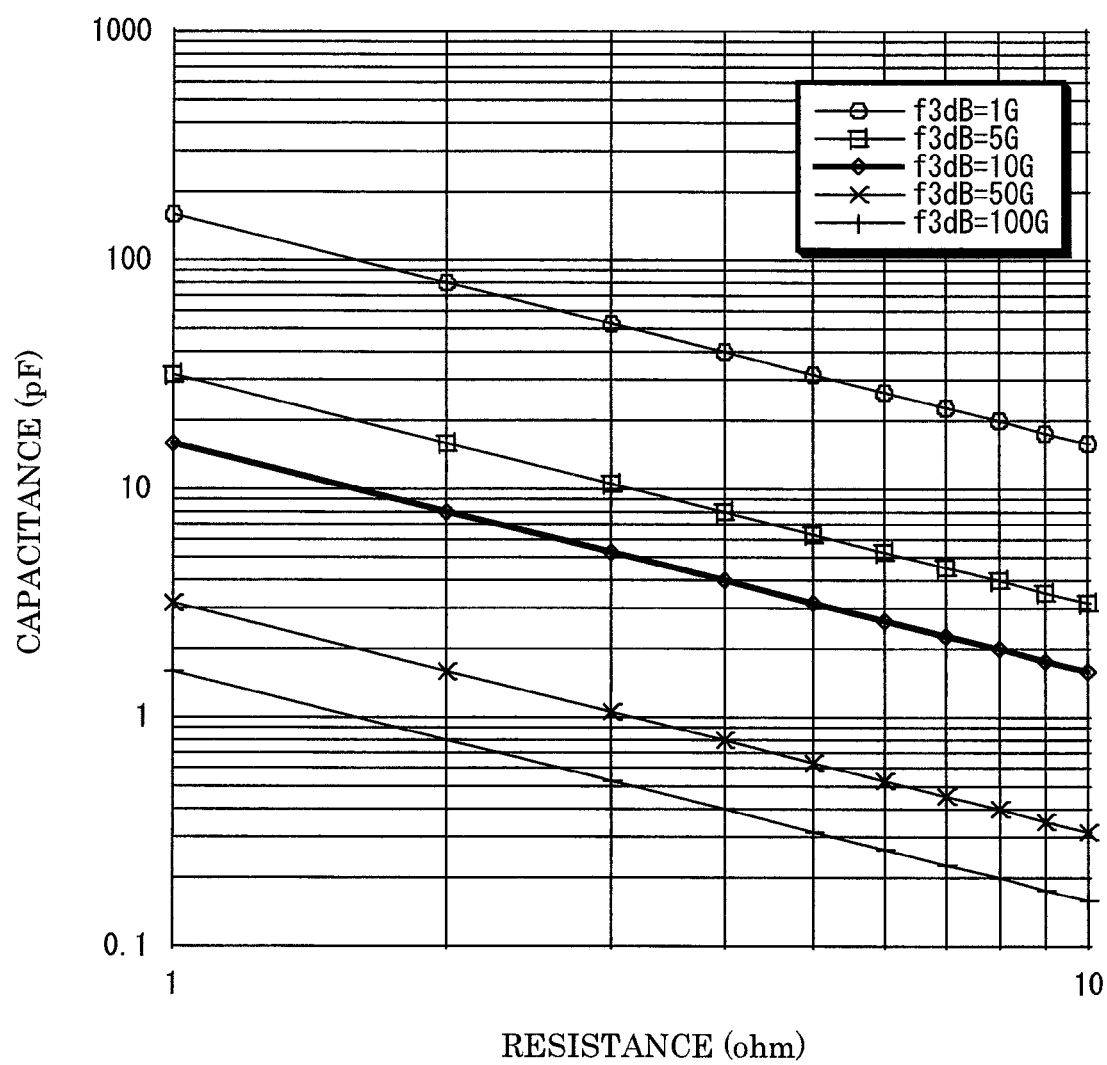
FIG. 14 is a figure describing a relationship between resistance and capacitance with 3 dB band.

FIG. 14 illustrates a relationship among 3 dB band, resistance, and capacitance. It can be understood that the device capacitance is necessary to be smaller than or equal to 3 pF when the device resistance is smaller than or equal to 5Ω in a modulating operation of 10 GB/s or faster.

FIG. 15 illustrates a dependency of the capacitance of the Ru—InP buffer layer on a thickness of the Ru—InP film in a case of having an area of 100 μm×100 μm for the n-electrode. To make the capacitance smaller than or equal to 3 pF, the Ru—InP film thickness is preferable to be larger than or equal to 0.5 μm. Thus, the minimum limit of the thickness is 0.5 μm. Meanwhile, the device will be subjected to polishing eventually to be thinned to a device thickness of about 150 μm. Thus, the thickness of 150 μm is sufficient for the Ru—InP layer, and it is the maximum limit. Therefore, from the view point of the growth rate, to achieve the thickness of 150 μm, a depositing method having a fast growth rate of several 10 μm/h such as hydride VPE method is more preferable than MOCVD.

Fifth Embodiment

A manufacture process of a semiconductor optical integrated device to which the present invention is applied according to a fifth embodiment will be described with reference to FIGS. 8A-8I. Note that the figures only describe the embodiment and the size of the figure is not necessarily the same with the scale and curvature mentioned in the present embodiment. While an example of using a Ru—InP substrate will be described here, it can be an Os—InP substrate.

Figure 8A:
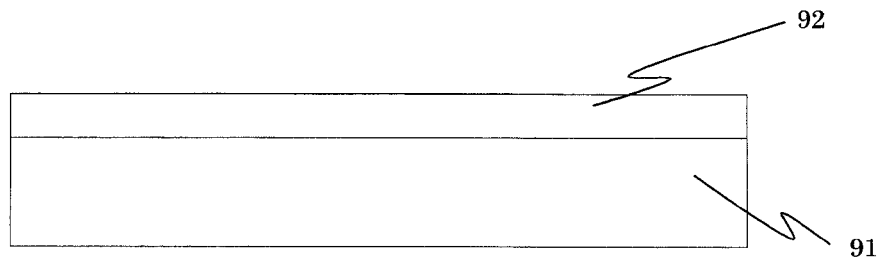
FIG. 8A is a figure describing a process flow of a semiconductor optical device for a fifth embodiment.
Figure 8B:
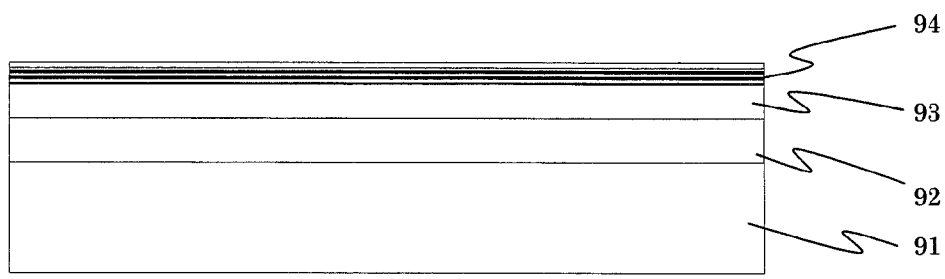
FIG. 8B is a figure describing the process flow of the semiconductor optical device for the fifth embodiment.
Figure 8C:
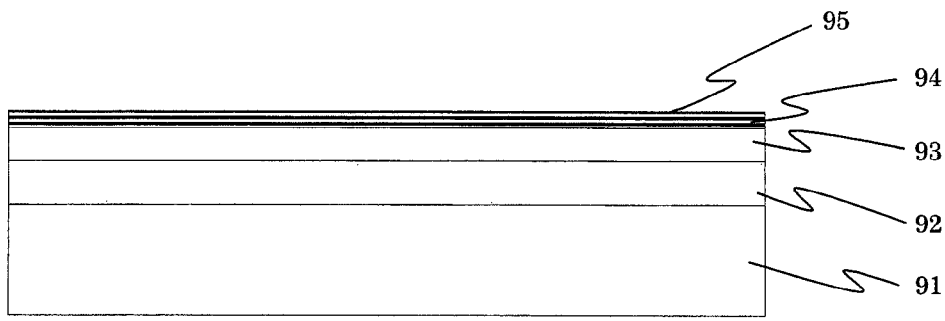
FIG. 8C is a figure describing the process flow of the semiconductor optical device for the fifth embodiment.
Figure 8D:
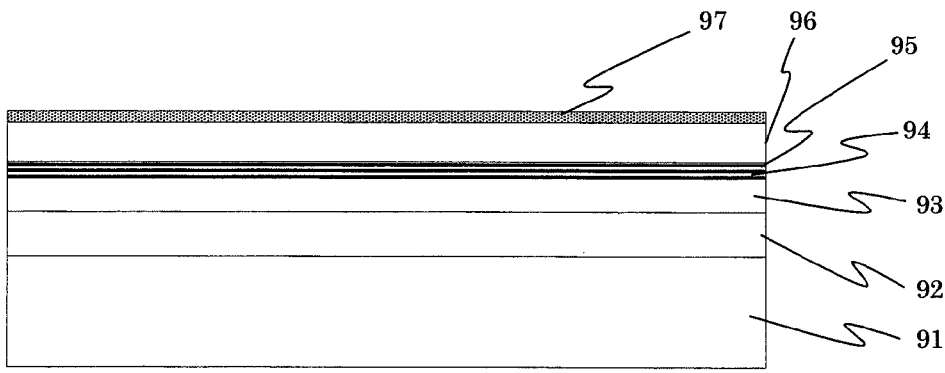
FIG. 8D is a figure describing the process flow of the semiconductor optical device for the fifth embodiment.
Figure 8E:
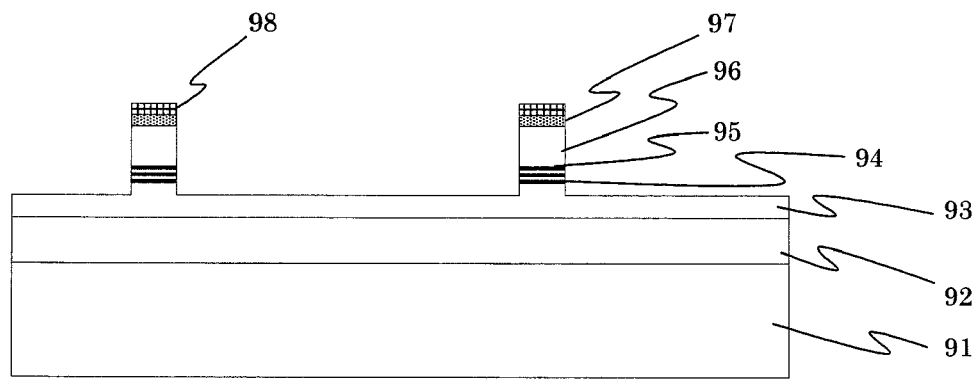
FIG. 8E is a figure describing the process flow of the semiconductor optical device for the fifth embodiment.

First, a Ru-doped SI—InP layer 92 is formed on a Ru—InP substrate 91 manufactured by the above-described method by MOCVD (FIG. 8A). Subsequently, an n-InP cladding 93 formed of S—InP and an undoped quantum-well structure 94 are sequentially stacked (FIG. 8B). As the quantum-well structure 94, an active layer suitable for laser oscillation can be formed by alternately stacking a quantum-well layer and a barrier layer formed of, for example, In, Ga, Al, or As to be about 10 layers. Subsequently, a grating structure 95 is formed by a combination of interference exposure and etching (FIG. 8C). Subsequently, a p-InP cladding formed of Zn—InP and a highly-p-doped p$^+$-contact layer 97 are sequentially stacked (FIG. 8D). Subsequently, a mesa is formed of a dielectric mask 98 by a combination of photolithography and etching (FIG. 8E). Subsequently, the mesa is buried with a semi-insulating InP layer 99 by regrowth to form a buried heterostructure (FIG. 8F).

Figure 8F:
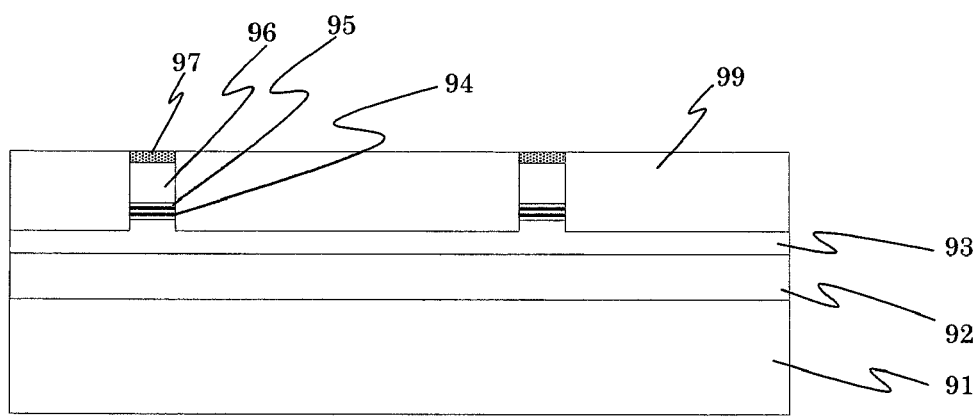
FIG. 8F is a figure describing the process flow of the semiconductor optical device for the fifth embodiment.
Figure 8G:
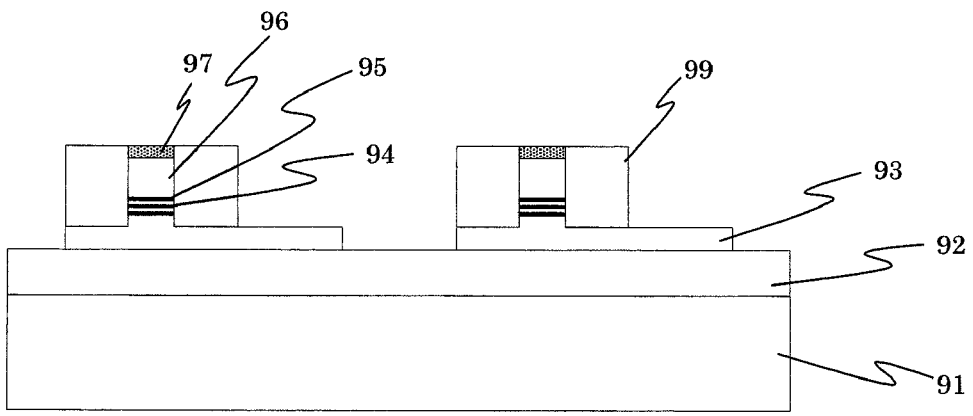
FIG. 8G is a figure describing the process flow of the semiconductor optical device for the fifth embodiment.
Figure 8H:
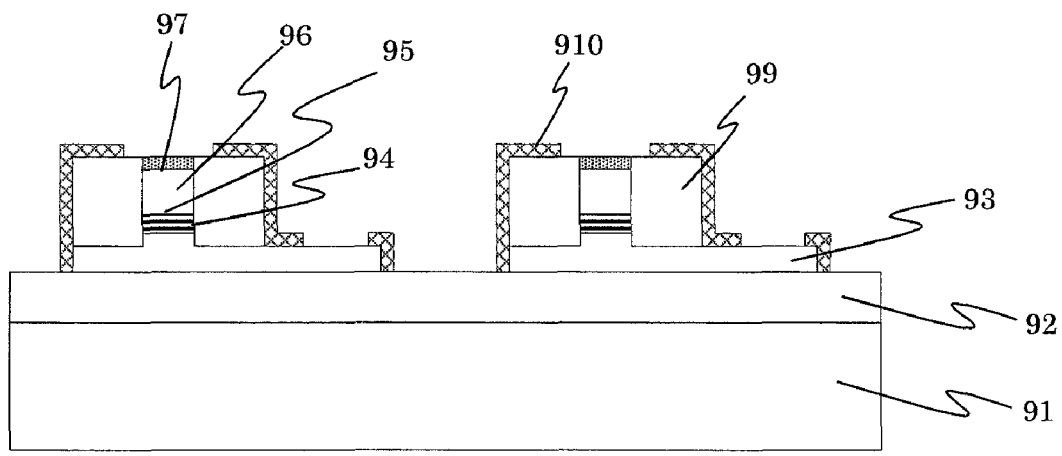
FIG. 8H is a figure describing the process flow of the semiconductor optical device for the fifth embodiment.
Figure 8I:
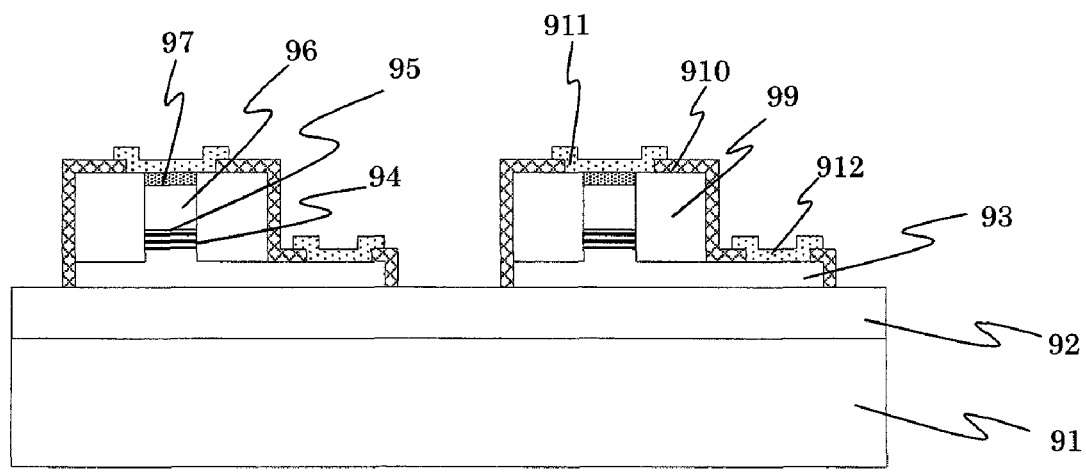
FIG. 8I is a figure describing the process flow of the semiconductor optical device for the fifth embodiment.
Figure 9:
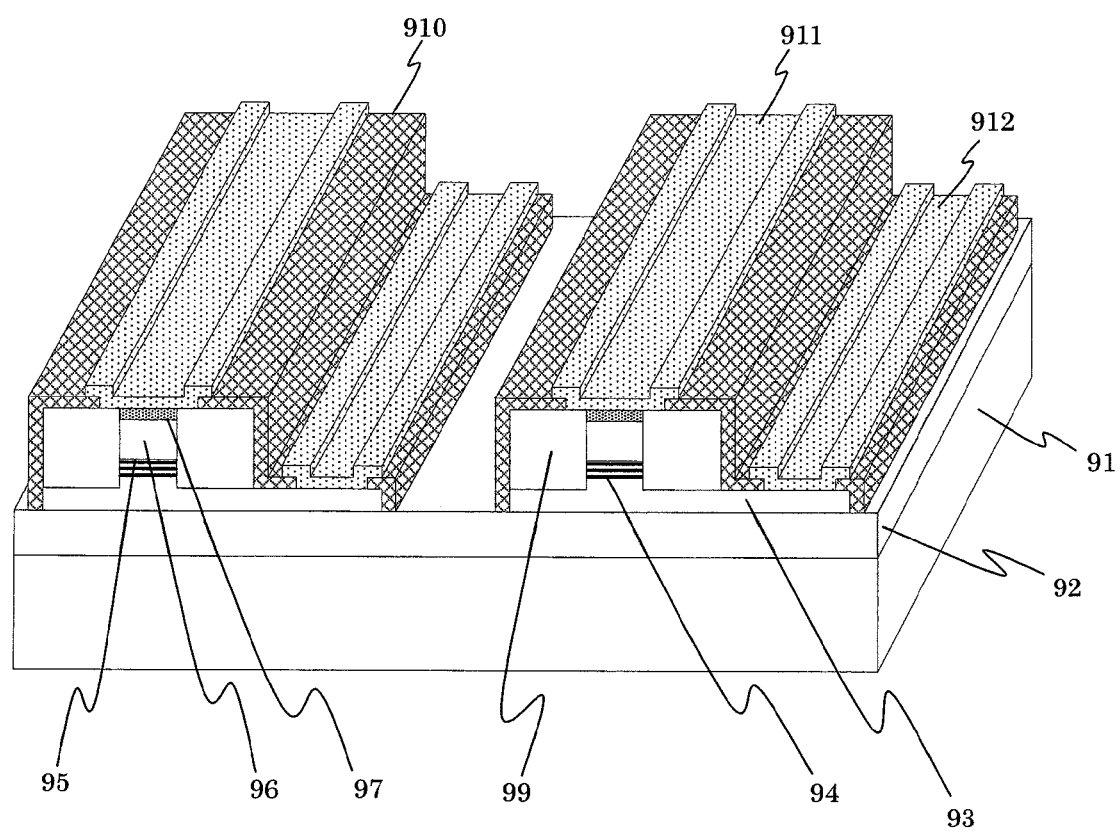
FIG. 9 is a perspective view of the semiconductor optical device for the fifth embodiment.
Figure 10:
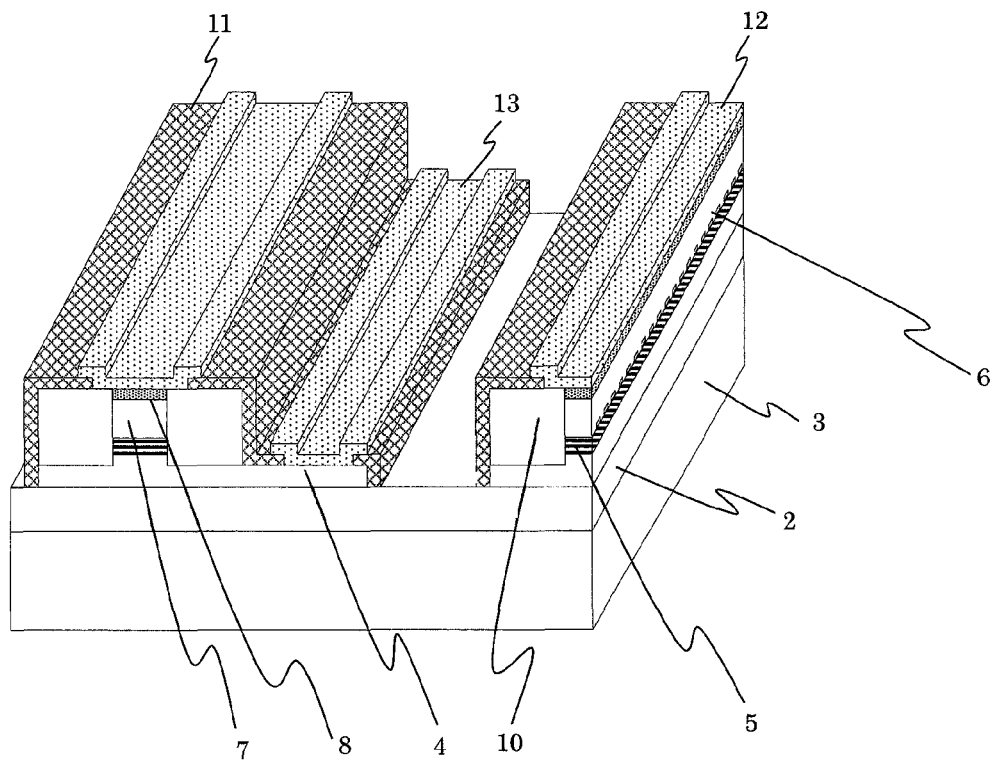
FIG. 10 is a figure describing a part of the cross-sectional view of the semiconductor optical device of the first embodiment viewed in a direction parallel to an optical axis.

Subsequently, by a combination of photolithography and etching, an n-InP layer formed of S—InP on the Ru-doped SI—InP is etched to be completely isolated among neighboring devices, and, the SI—InP layer formed in FIG. 8F is removed by etching for an electrode contact on the n-type side. At this time, it is necessary to adjust the depth of the etching so that the n-InP layer is left with a desired thickness (FIG. 8G). Subsequently, after forming an insulating film on the entire surface of the wafer, through-holes are formed by a combination of photolithography and etching so that the semiconductor portions at electrode contact positions of a p-type side 911 and an n-type side are exposed, respectively (FIG. 8H). As the insulating film (passivation film) here, silicon oxide is suitable, for example. Subsequently, electrodes (DFB laser p-electrode 911, n-electrode 912) of a known material Ti/Au or the like are formed to the through-hole parts formed in FIG. 8H (FIG. 8I). Finally, the wafer is cleaved into bars, and both edge surfaces are coated with a dielectric film having a desired reflectivity, thereby achieving a DFB laser array in which neighboring devices are electrically isolated. A perspective view of the semiconductor optical device is illustrated in FIG. 9, and a partial cross-sectional view of FIG. 9 in an optical axis direction is illustrated in FIG. 10.

While a device having a buried hetero waveguide has been described in the present embodiment, the device can be used also for a ridge waveguide and other waveguide structures in general.

Moreover, while a configuration example of a distributed feedback (DFB) laser has been described in the present embodiment, it can be not only a semiconductor laser but also a semiconductor optical amplifier, and it is needless to say that it is effective to also an optical integrated device including a semiconductor laser and a semiconductor optical amplifier. As some parts to be included in the optical integrated device, the following (A) to (D) are listed.

(A) Distributed feedback (DFB) laser, distributed Bragg reflector (DBR) laser, and semiconductor optical amplifier (SOA);

(B) Electroabsorption (EA) modulator, Mach-Zehnder (MZ) modulator, and optical directional coupler (DC) modulator;

(C) PIN photodiode (PD), and avalanche photodiode (APD); and (D) Passive waveguide, multimode interferometer (MMI), array waveguide grating (AWG).

Sixth Embodiment

Figure 11:
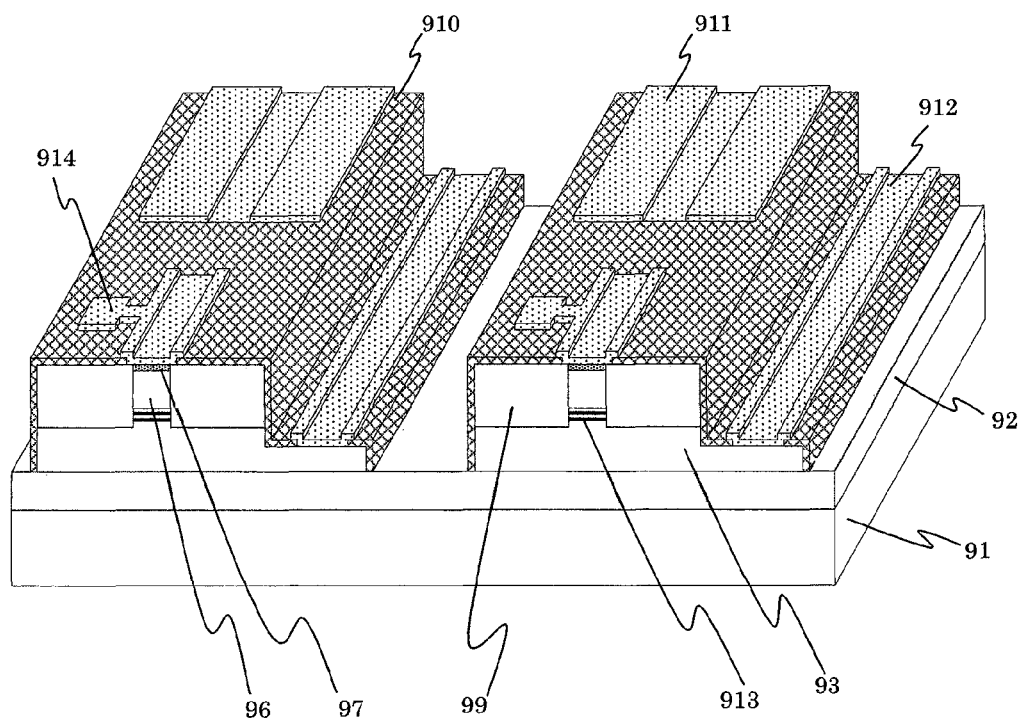
FIG. 11 is a perspective view of a semiconductor optical device (OEIC: optical electrical integrated circuit) for a sixth embodiment.

A manufacture process of a semiconductor optical integrated device according to a sixth embodiment will be described with reference to FIG. 11. Note that the figure only describes the embodiment and the size of the figure is not necessarily the same with the scale and curvature mentioned in the present embodiment. While an example of using a Ru—InP substrate will be described here, it can be an Os—InP substrate.

First, an SI—InP layer to which Ru is doped is formed on a Ru—InP substrate manufactured in the above-described manner by MOCVD. Subsequently, an InP cladding having an n-type conductivity and an undoped quantum-well structure are sequentially stacked. As the quantum-well structure, an active layer suitable for laser oscillation can be formed by alternately stacking a quantum-well layer and a barrier layer formed of, for example, In, Ga, Al, or As to be about 10 layers. A quantum-well structure suitable for an optical absorption layer of an electroabsorption optical modulator can be formed. Subsequently, by a combination of photolithography and etching, the undoped quantum-well layer is removed with leaving only the active layer having a desired length. At this time, a dielectric is used as a mask in the etching. Subsequently, an undoped InGaAsP bulk layer to be a passive optical waveguide is regrown. Subsequently, with leaving a region corresponding to the DFB laser previously grown and the passive waveguide having a desired length, the undoped InGaAsP bulk layer is etched by a combination of photolithography and etching. Subsequently, an undoped quantum-well layer to be an optical absorption layer of the electroabsorption (EA) layer is regrown. Here, as the quantum-well structure, a quantum-well structure suitable for an optical absorption layer of the electroabsorption layer can be formed by alternately stacking a quantum-well layer and a barrier layer formed of, for example, In, Ga, Al, or As to be about 10 layers. In addition, the order of regrowing the respective optical functional parts is not limited to the above one. Subsequently, a grating structure is formed only in the region corresponding to the DFB laser by a combination of interference exposure and etching. Subsequently, an InP cladding having a p-type conductivity and a highly-p-doped electrode contact layer are sequentially stacked on the entire surface of the wafer. Subsequently, a mesa is formed by a combination of photolithography and etching. Subsequently, a buried heterostructure is formed by regrowth. Subsequently, a Ru-doped n-InP layer on the SI—InP is etched to be completely isolated among neighboring devices, and the SI—InP layer previously formed is etched for an electrode contact on the n-type side. Here, it is necessary to adjust the depth of the etching so that the n-InP layer is left with a desired thickness. Subsequently, after forming an insulating film on the entire surface of the wafer, through-holes are formed by a combination of photolithography and etching so that only the semiconductor portion at the electrode contact position of each of the p-type side and n-type side of the EA modulator and DFB laser is exposed. As the insulating film here, silicon oxide is suitable, for example. Subsequently, an electrode of a known material, for example, Ti/Au is formed to the through-hole portion previously formed. Finally, the wafer is cleaved into bars, and both etch surfaces are coated with a dielectric film having a desired reflectivity, thereby achieving an EA/DFB laser array in which neighboring devices are electrically isolated.

While a device having a buried hetero waveguide has been described in the present embodiment, a semiconductor optical device having an OEIC device in which neighboring optical functional devices are electrically isolated can be achieved in the same manner also when the device is used for a ridge waveguide and other waveguide structures in general.

Moreover, while the drawing in which an EA modulator and a DFB laser are integrated is illustrated to avoid complexity of the drawing in the present embodiment, the present embodiment can be not only a semiconductor laser but also a semiconductor optical amplifier, and it is needless to say that the present embodiment is effective to an optical integrated device including a semiconductor layer and a semiconductor optical amplifier also. The following (A) to (D) are listed as parts to be included in the optical integrated device, for example.

(A) Distributed feedback (DFB) laser, distributed Bragg reflector (DBR) laser, and semiconductor optical amplifier (SOA);
(B) Electroabsorption (EA) modulator, Mach-Zehnder (MZ) modulator, and optical directional coupler (DC) modulator;
(C) PIN photodiode (PD), and avalanche photodiode (APD); and
(D) Passive waveguide, multimode interferometer (MMI), array waveguide grating (AWG).

Seventh Embodiment

Figure 12:
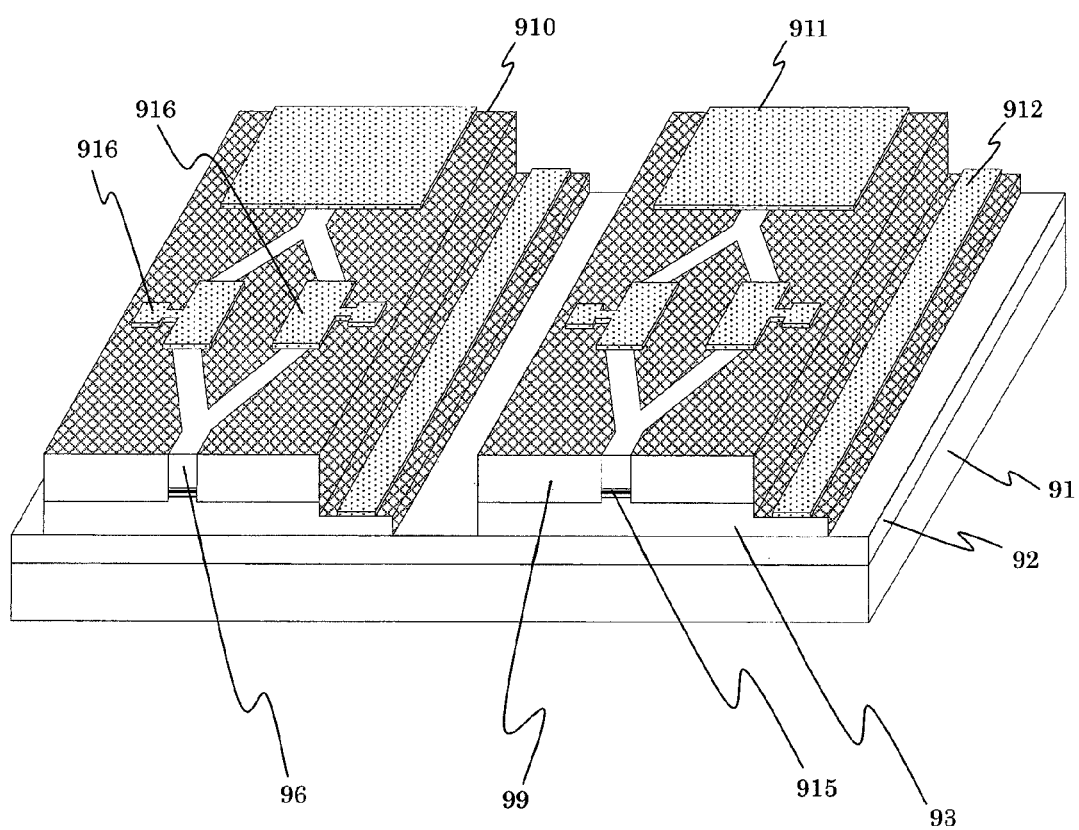
FIG. 12 is a perspective view of a semiconductor optical device (OEIC: optical electrical integrated circuit) for a seventh embodiment.

A seventh embodiment of a semiconductor optical device to which the present invention is applied is illustrated in FIG. 12. Note that the figure only describes the embodiment and the size of the figure is not necessarily the same with the scale and curvature mentioned in the present embodiment. Incidentally, as a method of forming the optical integrated device can be easily suggested from the sixth embodiment, detailed descriptions will be omitted here.

As the present invention is applied, a semiconductor integrated array in which a Mach-Zehnder (MZ) modulator and a DFB laser are monolithically integrated as illustrated in FIG. 12 can be achieved.

While a device having a buried hetero waveguide has been described in the present embodiment, a semiconductor optical device having an OEIC device in which neighboring optical functional devices are electrically isolated can be achieved in the same manner also when the device is used for a ridge waveguide and other waveguide structures in general.

Further, while the drawing in which a MZ modulator and a DFB laser are integrated is illustrated to avoid complexity of the drawing in the present embodiment, the present embodiment can be not only a semiconductor laser but also a semiconductor optical amplifier, and it is needless to say that the present embodiment is also effective to an optical integrated device including a semiconductor laser and a semiconductor optical amplifier. The following (A) to (D) are listed as parts to be included in the optical integrated device, for example.

(A) Distributed feedback (DFB) laser, distributed Bragg reflector (DBR) laser, and semiconductor optical amplifier (SOA);
(B) Electroabsorption (EA) modulator, Mach-Zehnder (MZ) modulator, and optical directional coupler (DC) modulator;
(C) PIN photodiode (PD), and avalanche photodiode (APD); and
(D) Passive waveguide, multimode interferometer (MMI), array waveguide grating (AWG).

Moreover, the effects of the present invention are not essentially changed even when the laser part has a thermal or electric function of making the lasing wavelength tunable.

Eighth Embodiment

Figure 13:
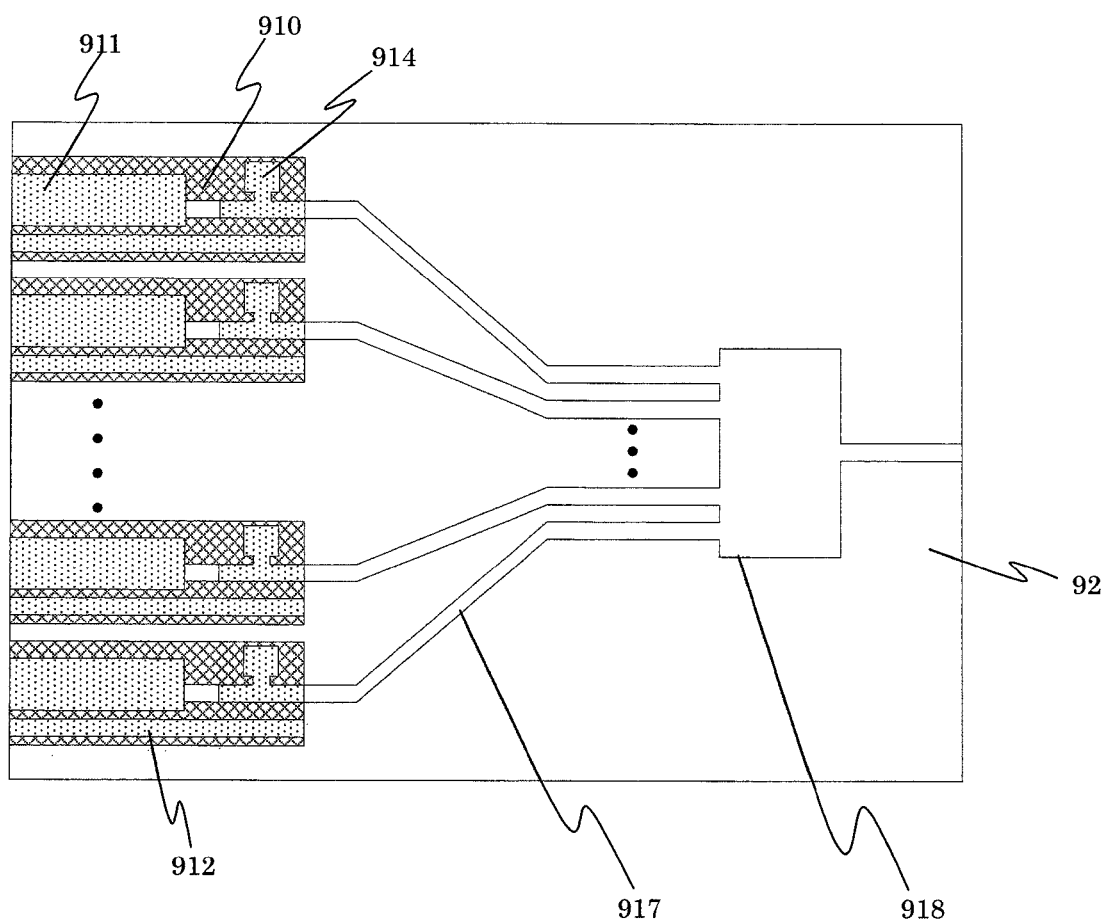
FIG. 13 is a perspective view of a semiconductor optical device (OEIC: optical electrical integrated circuit) for an eighth embodiment.

An eighth embodiment of a semiconductor optical device to which the present invention is applied is illustrated in FIG. 13. Note that the figure only describes the embodiment and the size of the figure is not necessarily the same with the scale and curvature mentioned in the present embodiment. While an example of using a Ru—InP substrate will be described here, it can be an Os—InP substrate.

Incidentally, as a method of forming an optical integrated device the eighth embodiment can be easily suggested from the sixth embodiment, detailed descriptions will be omitted here.

In the present embodiment, optical outputs of the EA/DFB laser arranged on an array as illustrated in FIG. 13 can be concentrated to one waveguide using a multimode interferometer (MMI).

While a device having a buried hetero waveguide has been described in the present embodiment, a semiconductor optical device having an OEIC device in which neighboring optical functional devices are electrically isolated can be achieved in the same manner also when the device is used for a ridge waveguide and other waveguide structures in general.

Further, while the drawing in which an EA modulator and a DFB laser are integrated is illustrated to avoid complexity of the drawing in the present embodiment, the present embodiment can be not only a semiconductor laser but also a semiconductor optical amplifier, and it is needless to say that the present embodiment is effective to an optical integrated device including a semiconductor laser and a semiconductor optical amplifier also. The following (A) to (D) are listed as parts included in the optical integrated device, for example.

(A) Distributed feedback (DFB) laser, distributed Bragg reflector (DBR) laser, and semiconductor optical amplifier (SOA);

(B) Electroabsorption (EA) modulator, Mach-Zehnder (MZ) modulator, and optical directional coupler (DC) modulator;
(C) PIN photodiode (PD), and avalanche photodiode (APD); and
(D) Passive waveguide, multimode interferometer (MMI), array waveguide grating (AWG).

Note that, the Ru—InP substrate 91 in the fifth to eighth embodiments can be replaced with an Fe—InP substrate based on the other concept of the invention mentioned above.

What is claimed is:

1. A semiconductor optical device comprising:
a semi-insulating substrate including a semi-insulating InP layer provided on a conductive InP layer, which has a first conductivity;
a semiconductor stacked-layer body stacked on the semi-insulating substrate; and
a first electrode, which supplies carriers of the first conductivity, and a second electrode, which supplies carriers of a second conductivity different from the first conductivity, over a same surface of the semi-insulating substrate.

2. The semiconductor optical device according to claim 1, wherein
zinc or sulfur is doped in the InP layer having the first conductivity, and
ruthenium or osmium is doped in the semi-insulating InP layer.

3. The semiconductor optical device according to claim 2, wherein
a thickness of the ruthenium-doped or osmium-doped semi-insulating InP layer is from 0.5 µm to 150 µm.

4. A semiconductor optical device comprising:
a semi-insulating substrate including a semi-insulating InP layer provided on a conductive InP layer, which has a first conductivity;
a semiconductor stacked-layer body stacked on the semi-insulating substrate; and
a first optical functional device and a second optical functional device, wherein
the first optical functional device includes a first electrode, which supplies carriers of the first conductivity, and a second electrode, which supplies carriers of a second conductivity different from the first conductivity, over a same surface of the semi-insulating substrate,
the second optical functional device includes a third electrode, which supplies carriers of the first conductivity, and a fourth electrode, which supplies carriers of the second conductivity different from the first conductivity, over said same surface of the semi-insulating substrate,
the first electrode and the third electrode are coupled together, and
the second electrode and the fourth electrode are isolated from each other.

5. The semiconductor optical device according to claim 1, wherein
the stacked-layer body includes a bottom cladding layer, an active layer, and a top cladding layer on the semi-insulating InP layer, and
the stacked-layer body forms part of a distributed feedback (DFB) laser, a distributed Bragg reflector (DBR) laser, or a semiconductor optical amplifier (SOA).

6. The semiconductor optical device according to claim 4, wherein
the first optical functional device is one of a distributed feedback (DFB) laser, a distributed Bragg reflector (DBR) laser, and a semiconductor optical amplifier (SOA).

7. A semiconductor optical device comprising:
a semi-insulating InP substrate including a semi-insulating InP to which ruthenium (Ru) or osmium (Os) is doped at least a surface of the semi-insulating InP;
an n-type semiconductor layer provided on the semi-insulating InP substrate;
an active layer stacked on the n-type semiconductor layer;
a p-type semiconductor layer stacked on the active layer;
a first electrode connected to the p-type semiconductor layer; and
a second electrode connected to the n-type semiconductor layer.

8. The semiconductor optical device according to claim 7, wherein
the semi-insulating InP substrate is formed of Ru-doped semi-insulating InP.

9. The semiconductor optical device according to claim 7, wherein
the semi-insulating InP substrate includes a Ru-doped semi-insulating InP layer stacked on a conductive InP substrate.

10. The semiconductor optical device according to claim 7, wherein
the semi-insulating InP substrate includes a Ru-doped semi-insulating InP layer stacked on an Fe-doped semi-insulating InP substrate.

11. The semiconductor optical device according to claim 7, wherein
the semiconductor optical device includes at least a semiconductor laser or a semiconductor optical amplifier.

12. The semiconductor optical device according to claim 11, wherein
a doping concentration of ruthenium or osmium of the semi-insulating substrate is in a range of $5\times10^{15}$ cm$^{-3}$ to $1\times10^{19}$ cm$^{-3}$.

13. The semiconductor optical device according to claim 12, wherein
concentrations of zinc (Zn), beryllium (Be), magnesium (Mg), carbon (C), silicon (Si), sulfur (S), and tin (Sn) is lower than $1\times10^{16}$ cm$^{-3}$.

14. The semiconductor optical device according to claim 13, wherein
a main surface of the substrate has (100) orientation, and the surface is slightly inclined at an angle from −0.05 degree to −0.2 degree.

15. The semiconductor optical device according to claim 4, wherein
zinc or sulfur is doped in the InP layer having the first conductivity, and
ruthenium or osmium is doped in the semi-insulating InP layer.

16. The semiconductor optical device according to claim 15, wherein
a thickness of the ruthenium-doped or osmium-doped semi-insulating InP layer is from 0.5 µm to 150 µm.

17. The semiconductor optical device according to claim 4, wherein
the stacked-layer body includes a bottom cladding layer, an active layer, and a top cladding layer on the semi-insulating InP layer, and
the stacked-layer body forms part of a distributed feedback (DFB) laser, a distributed Bragg reflector (DBR) laser, or a semiconductor optical amplifier (SOA).

* * * * *